US007947951B2

(12) United States Patent
Khursheed

(10) Patent No.: US 7,947,951 B2
(45) Date of Patent: May 24, 2011

(54) MULTI-BEAM ION/ELECTRON SPECTRA-MICROSCOPE

(75) Inventor: Anjam Khursheed, Singapore (SG)

(73) Assignee: National University of Singapore, Singapore (SG)

( * ) Notice: Subject to any disclaimer, the term of this patent is extended or adjusted under 35 U.S.C. 154(b) by 302 days.

(21) Appl. No.: 12/309,345

(22) PCT Filed: Jul. 20, 2007

(86) PCT No.: PCT/SG2007/000218
§ 371 (c)(1),
(2), (4) Date: Jan. 13, 2009

(87) PCT Pub. No.: WO2008/010777
PCT Pub. Date: Jan. 24, 2008

(65) Prior Publication Data
US 2009/0321634 A1 Dec. 31, 2009

Related U.S. Application Data

(60) Provisional application No. 60/832,640, filed on Jul. 21, 2006.

(51) Int. Cl.
H01J 37/26 (2006.01)
H01J 37/153 (2006.01)
(52) U.S. Cl. ........ 250/305; 250/306; 250/307; 250/309; 250/310; 250/492.21; 250/492.23; 250/492.3; 250/493.1
(58) Field of Classification Search .................. 250/305, 250/306, 307, 309, 310, 492.21, 492.23, 250/492.3, 493.1
See application file for complete search history.

(56) References Cited

U.S. PATENT DOCUMENTS

| 5,008,537 | A | | 4/1991 | Toita et al. | |
|---|---|---|---|---|---|
| 5,041,724 | A | * | 8/1991 | Feuerbaum et al. | 250/307 |
| 5,486,769 | A | * | 1/1996 | Chim et al. | 324/754.22 |
| 6,608,305 | B1 | * | 8/2003 | Kin et al. | 250/306 |
| 6,897,441 | B2 | * | 5/2005 | Khursheed | 850/9 |
| 7,294,834 | B2 | * | 11/2007 | Khursheed | 250/310 |
| 7,326,928 | B2 | * | 2/2008 | Khursheed | 250/310 |
| 7,560,691 | B1 | * | 7/2009 | Gubbens | 250/305 |
| 7,791,053 | B2 | * | 9/2010 | Buttrill | 250/493.1 |
| 7,855,362 | B1 | * | 12/2010 | Brodie et al. | 250/305 |
| 2004/0004773 | A1 | * | 1/2004 | Khursheed | 359/800 |
| 2004/0061054 | A1 | | 4/2004 | Kondo et al. | |
| 2004/0079884 | A1 | * | 4/2004 | Khursheed et al. | 250/311 |
| 2006/0060782 | A1 | * | 3/2006 | Khursheed | 250/310 |

(Continued)

FOREIGN PATENT DOCUMENTS

JP 9-264858 A 10/1997

(Continued)

Primary Examiner — David A Vanore
(74) Attorney, Agent, or Firm — Lerner, David, Littenberg, Krumholz & Mentlik, LLP

(57) ABSTRACT

This invention is a multi-beam charged particle instrument that can simultaneously focus electrons and a variety of positive and negative ions, such as Gallium, Oxygen and Cesium ions, onto the same material target. In addition, the instrument has provision to simultaneously capture the spectrum of both secondary electrons and ions. The highly dispersive, high resolution mass spectrometer portion of the instrument is expected to detect and identify secondary ion species across the entire range of the periodic table, and also record a portion of their emitted energy spectrum. The electron energy spectrometer part of the instrument is designed to acquire the entire range of scattered electrons, from the low energy secondary electrons through to the elastic backscattered electrons.

44 Claims, 14 Drawing Sheets

Schematic for ray paths of
primary and scattered charged particles

U.S. PATENT DOCUMENTS

| | | |
|---|---|---|
| 2006/0097166 A1 | 5/2006 | Ishitani et al. |
| 2006/0151696 A1* | 7/2006 | Khursheed .................... 250/310 |
| 2009/0321634 A1* | 12/2009 | Khursheed .................... 250/307 |
| 2010/0127168 A1* | 5/2010 | Khursheed .................... 250/305 |
| 2010/0301211 A1* | 12/2010 | Miller ........................... 250/307 |
| 2010/0320382 A1* | 12/2010 | Almogy et al. ............... 250/307 |

FOREIGN PATENT DOCUMENTS

| | | |
|---|---|---|
| WO | WO-02/075806 A1 | 9/2002 |

* cited by examiner

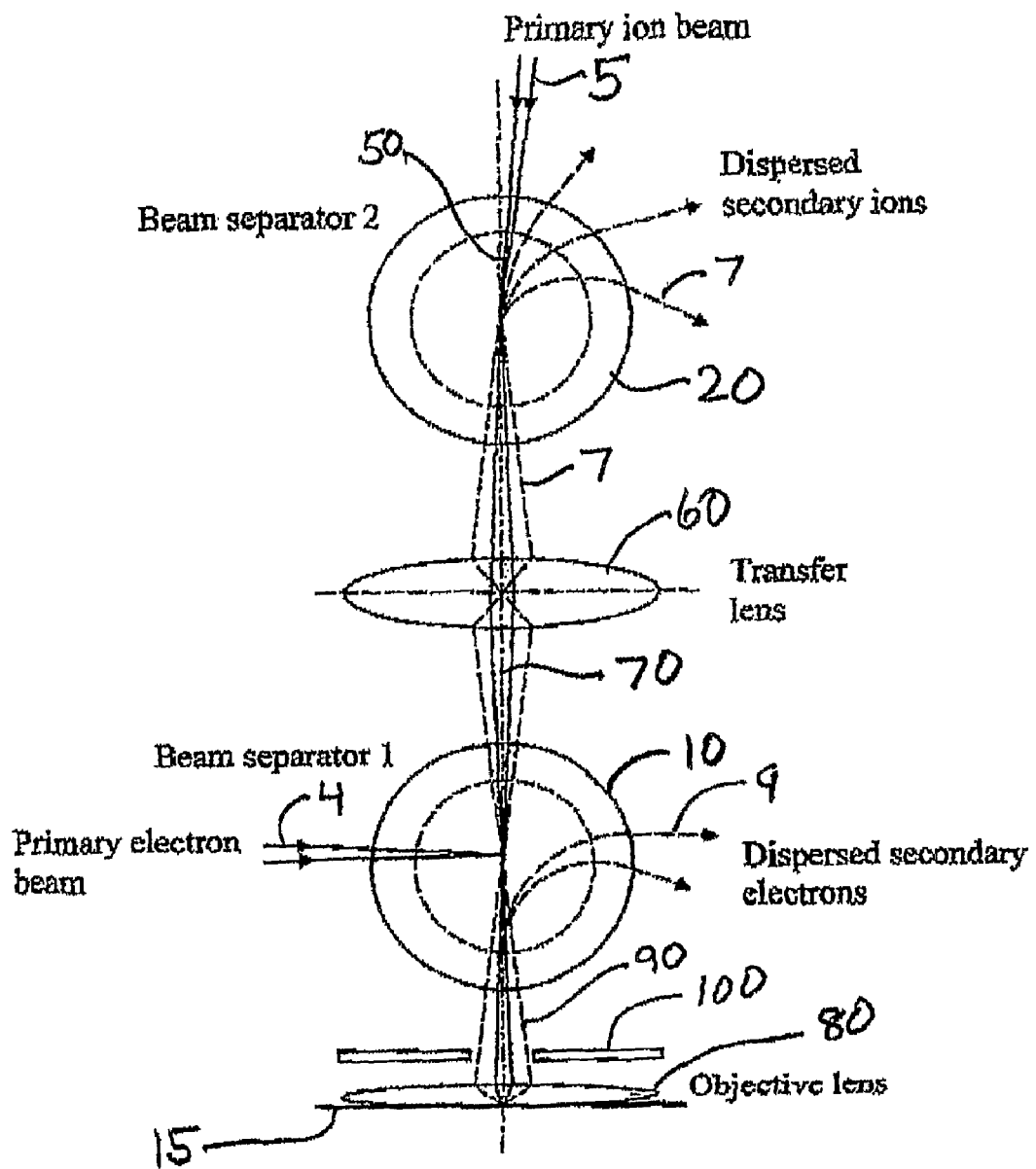
Figure 1: Schematic for ray paths of primary and scattered charged particles

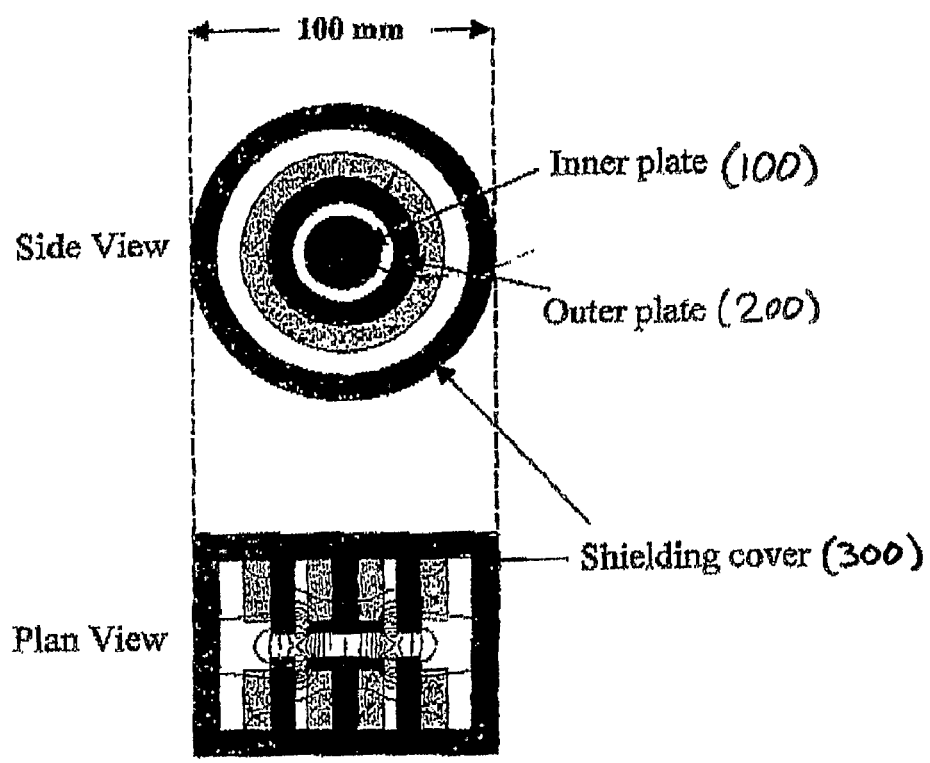
Figure 3: Layout of a beam separator capable of acting as a round-lens: dark shaded areas indicate magnetic material, while light shaded areas denote current carrying coil.

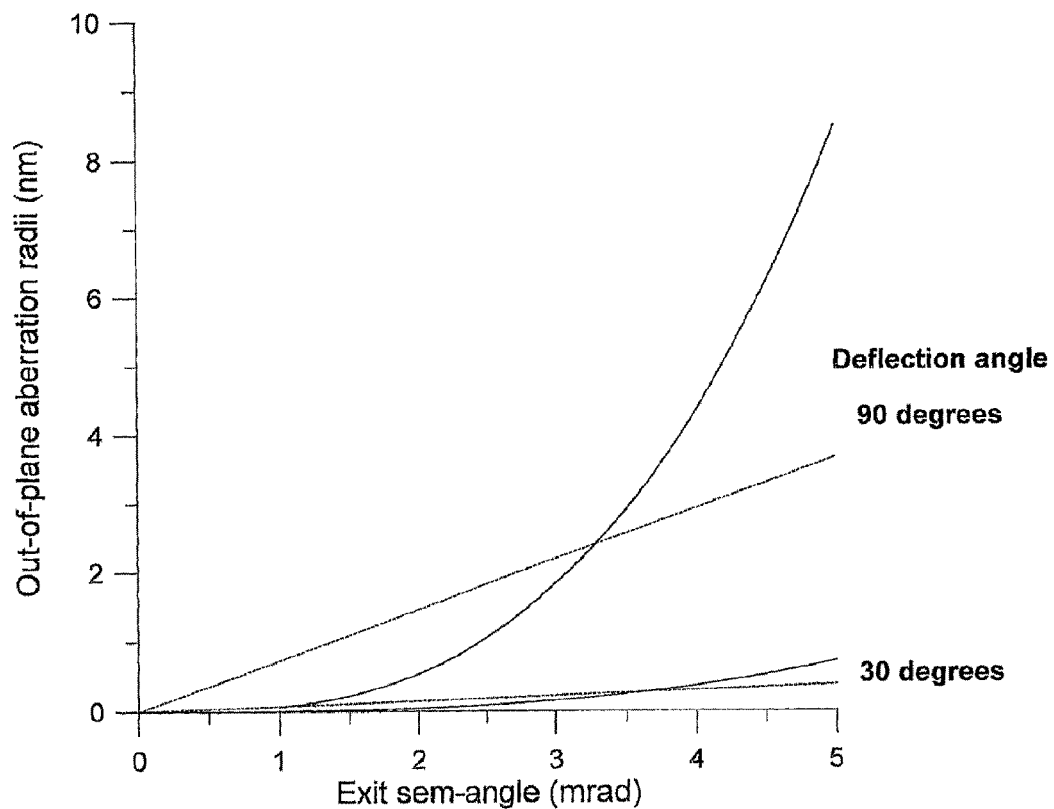
Figure 4: Simulated out-of-plane beam separator aberrations for a 10 keV Gallium ion beam as a function of exit angle for an energy spread of 10 eV. The dashed lines represent chromatic aberration, while the solid line denotes spherical aberration

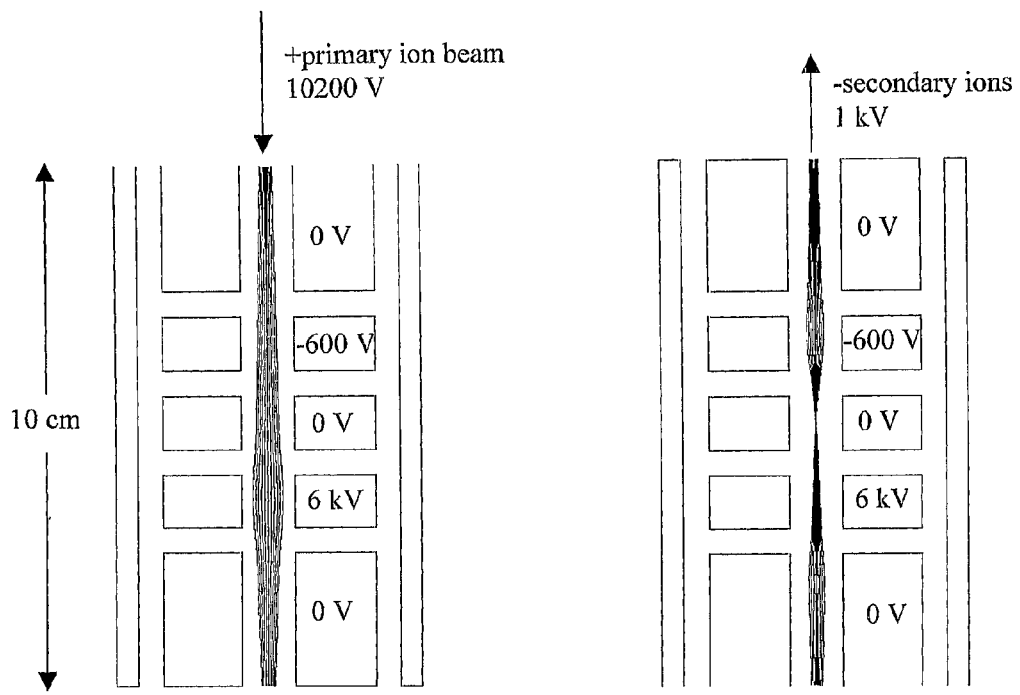
Figure 5: Example ion trajectory paths through transfer lens where source and image planes are located 50 mm above and below it. Entrance angles vary in the 0 to 20 mrad range in steps of 2 mrad
    a) 10.2 keV primary ion beam
    b) 1 keV secondary ions

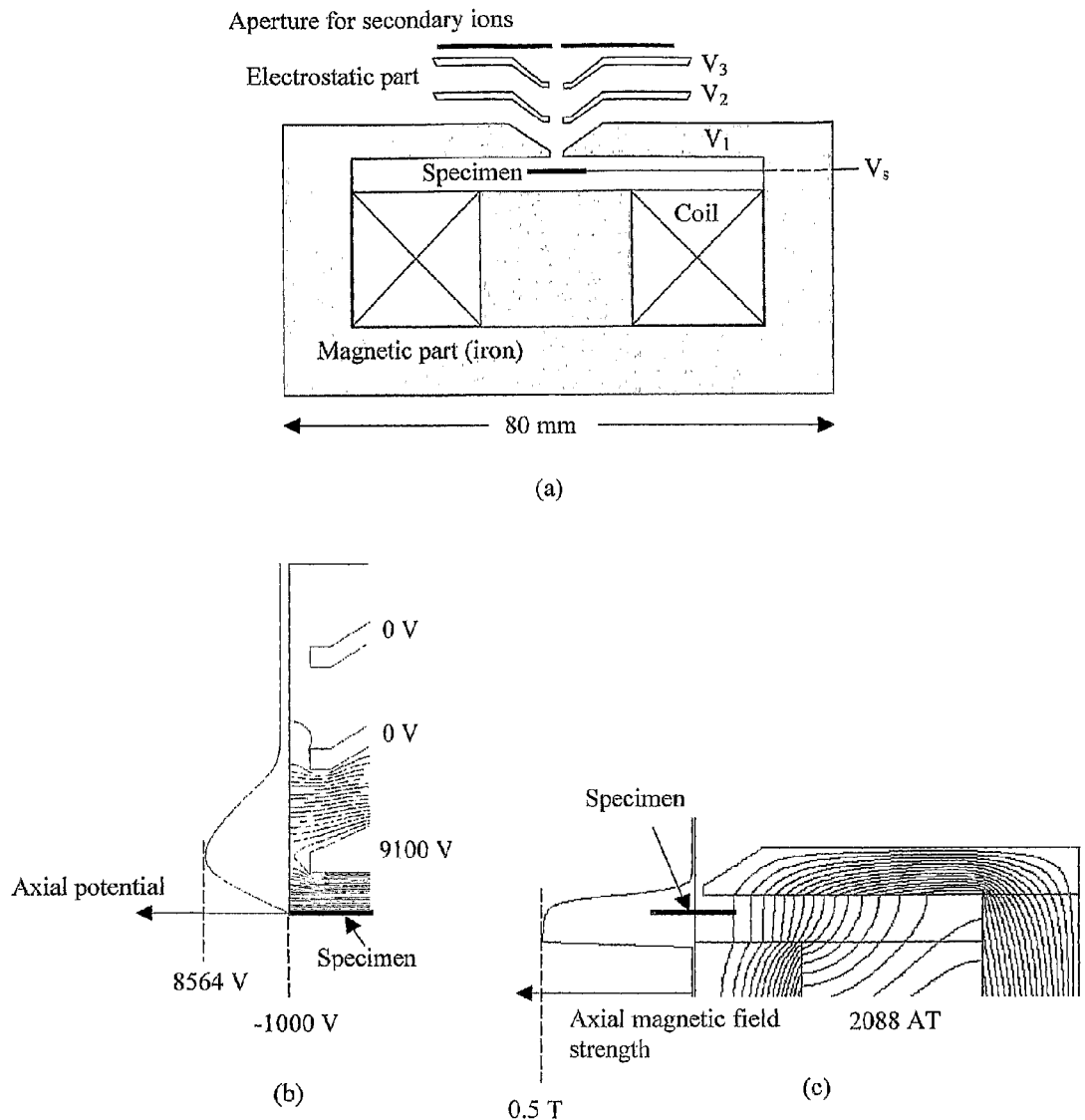
Figure 6: Simulated objective lens design
(a) Layout
(b) Equipotential lines
(c) Flux lines Fig. 7: Simulated trajectory paths of negative secondary ions through the objective lens. The emission angle varies from 0 to 1.3 radians in intervals of 0.1
(a) 5 eV energy with $V_2 = 0$
(b) 5 eV energy with $V_2 = 600$ V
(c) 5 eV energy with $V_2 = 425$ V
(d) 30 eV energy with $V_2 = 425$ V

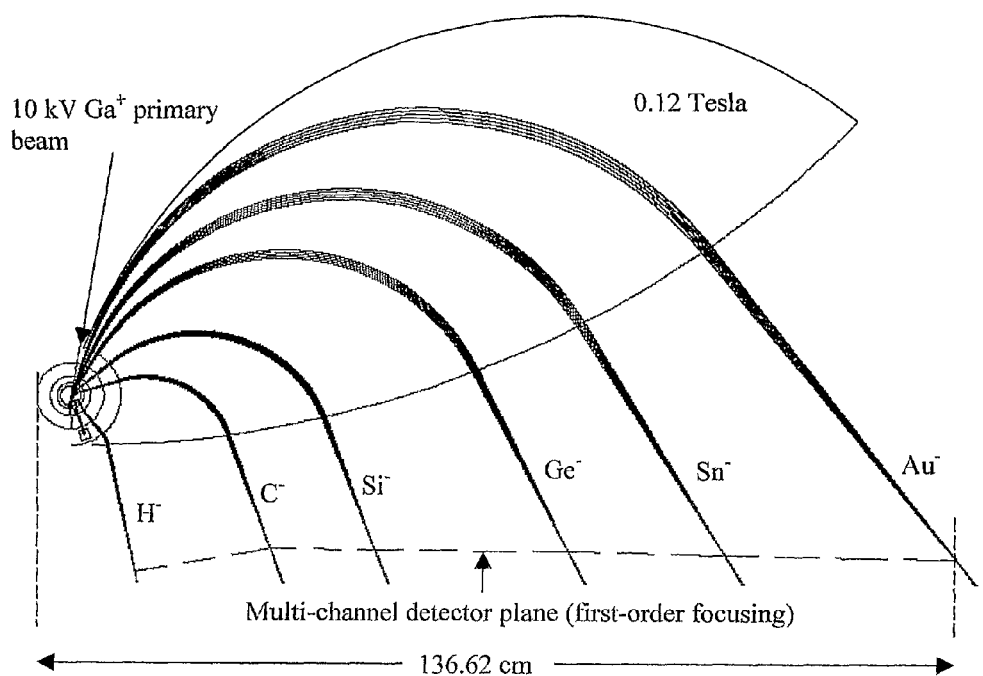

Figure 8: Simulated trajectory paths of 1005 eV selected secondary ions through the beam separator and postdeflector. Initial angles at the beam separator entrance plane converge at 0, 10 and 20 mrad with respect to the vertical axis and are directed to the beam separator centre. A single retarding sector unit is used to mirror the hydrogen ions for a second pass through the beam separator.

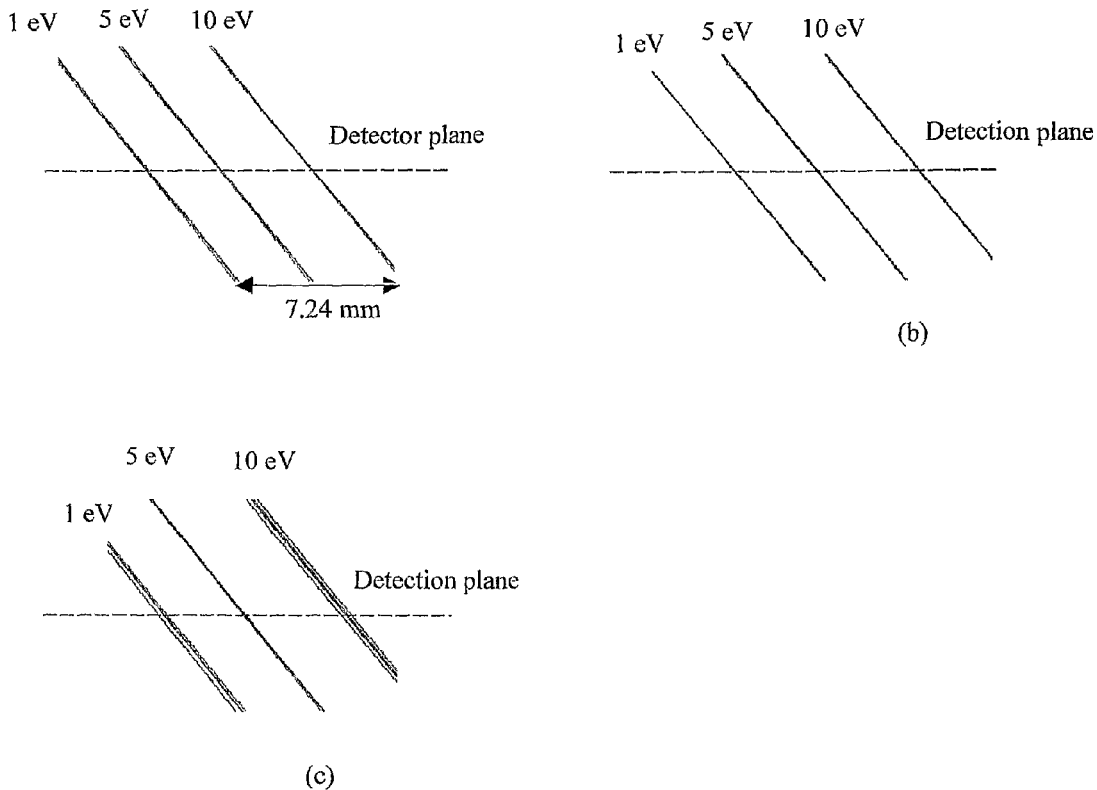

Figure 9: Simulated trajectory paths as they arrive at the detection plane for secondary gold ions emitted with energies of 1, 5, and 10 eV from a −1 kV biased specimen
(a) Hypothetical situation of trajectories starting at beam separator 2 entrance with angles ± 10 mrad directed towards its centre
(b) Trajectories starting from the specimen to the detection plane, starting at angles 0 to 1.5 radians for an aperture radius of 200 μm
(c) Trajectories starting from the specimen to the detection plane, starting at angles 0 to 1.5 radians for an aperture radius of 600 μm

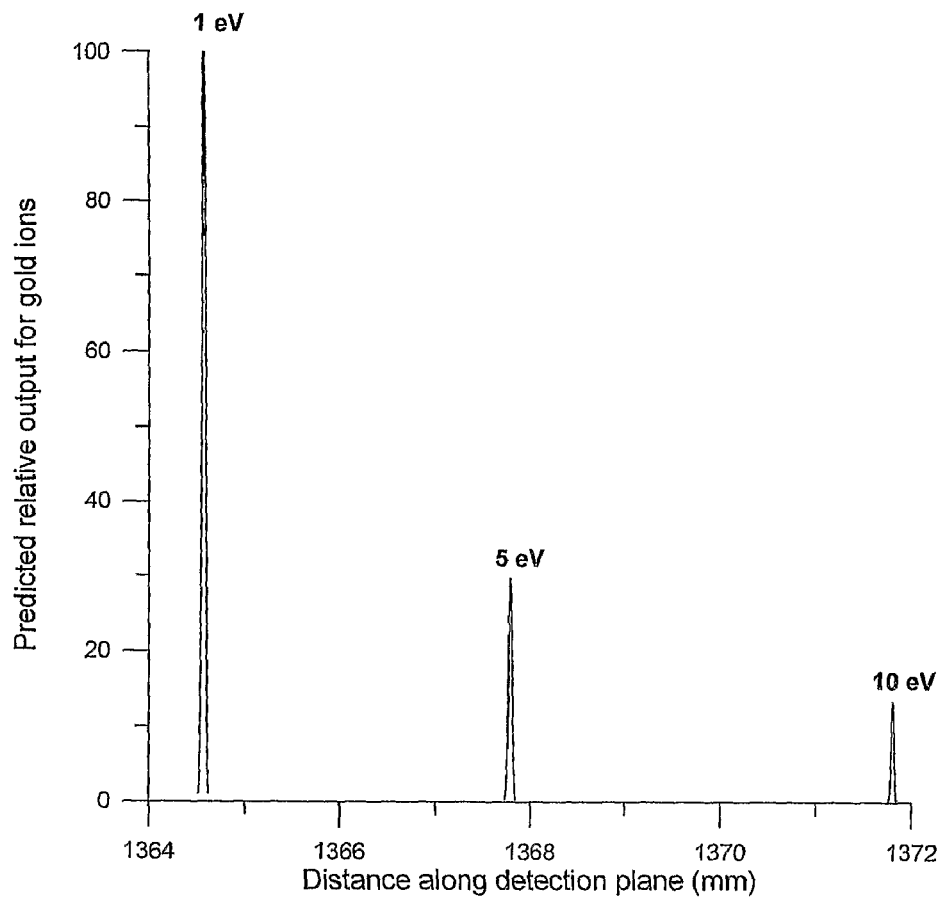
Figure 10: Simulated output spectrum for 1, 5, and 10 eV secondary gold ions leaving a -1 kV biased specimen over a wide-range of emission angles for a 200 μm radius secondary ion aperture

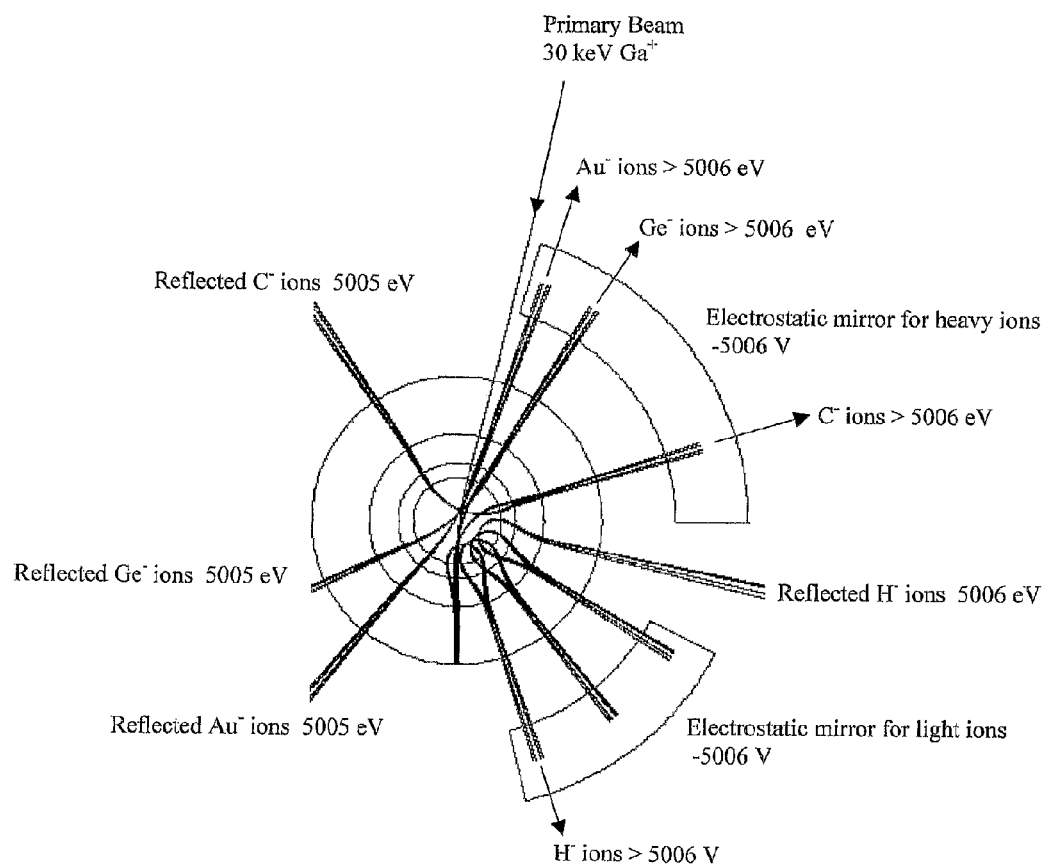
Figure 11: Trajectory paths illustrating the filtering and mirroring of secondary ions through the beam separator

| $V_1 = +9.1$ kV, $V_2=0$, $V_3=0$ | Landing energy (keV) | Focal length (mm) | Axial spherical coef. (mm) | Axial chromatic coef. (mm) |
|---|---|---|---|---|
| 6 keV electron beam, $V_s = -1$ kV | 5.0 | 1.22 | 0.437 | 0.441 |
| 9.924 kV +ion primary beam, $V_s = -1$ kV | 10.924 | 2.88 | 10.33 | 16.26 |
| 9.752 kV +ion primary beam, $V_s = +9.1$ kV | 0.652 | 2.15 | 6.27 | 1.92 |

(a)

| $V_1 = +9.1$ kV, $V_2=0$, $V_3=0$ | Landing energy (keV) | Source energy spread (eV) | Source brightness (A/cm² sr⁻¹) | Predicted probe diameter (nm) Primary beam currents | | |
|---|---|---|---|---|---|---|
| | | | | 0 | 1pA | 1nA |
| 6 keV electron beam, $V_s = -1$ kV | 5.0 | 0.4 | $10^8$ | 0.613 | 0.625 | 1.45 |
| 9.924 kV $Cs^+$ beam, $V_s = -1$ kV, (surface ionization source) | 10.924 | 0.2 | $10^3$ | 0.051 | 17.09 | 227.09 |
| 9.924 kV $Ga^+$ beam, $V_s = -1$ kV (liquid metal ion source) | 10.924 | 5.0 | $10^6$ | 0.3 | 5.67 | 32.21 |
| 9.924 kV oxygen primary beam $V_s = +1$ kV (duoplasmatron source) | 10.924 | 10.0 | 100 (O⁺)  200 ($O_2^+$) | 0.612  0.515 | 80.81  67.80 | 585.72  465.02 |
| 9.752 kV $O_2^-$ beam, (duoplasmatron source) $V_s = +9100$ V | 0.652 | 10.0 | 200 | 1.46 | 94.98 | 551.07 |

Table 1

MULTI-BEAM ION/ELECTRON SPECTRA-MICROSCOPE

RELATED PATENT APPLICATION

The present application is a national phase entry under 35 U.S.C. §371 of International Application No. PCT/SG2007/000218 filed Jul. 20, 2007, published in English, which claims priority from United States Provisional Patent Application No. 60/832,640 filed Jul. 21, 2006, all of which are incorporated herein by reference.

BACKGROUND OF THE INVENTION

1. Field of the Invention

This invention relates to the use of a focused beam analytic instrument designed to obtain topographical, elemental and chemical information about a material sample by impinging deflected electron and ion beams upon that sample and interpreting the mass and energy spectra of resulting emissions from that sample.

2. Description of the Related Art

At present, Focused Ion Beam instruments (FIBs), Scanning Electron Microscopes (SEMs), Secondary Ion Mass Spectrometers (SIMS) and Auger Electron Spectrometers (AES) usually operate separately. Although each of these charged particle beam instruments has its own respective domain of usefulness, there are definite advantages to integrating them into one complete instrument. FIBs, most commonly used to make connections, repairs, milling and cross-sectioning of materials on the nano-scale, can benefit from the high imaging resolution capability that SEMs provide in order to closely monitor changes made to the specimen. On the other hand, both SEMs and FIBs would benefit from being able to carry out chemical-elemental mapping analysis, the kind performed by SIMS or AES. In principle, one single instrument would be able to mill, cross-section and repair samples on the nano-scale while at the same time be able to acquire high resolution topographical, elemental and chemical maps of the samples' surface.

There are at present, dual SEM-FIB, FIB-SIMS and FIB-AES systems (L. A. Giannuzzi and F. A. Stevie, *Introduction to Focused Ion Beams*, Springer 2005, chapters 12, 13 and 15) however their integration is only partial. In the dual SEM-FIB or FIB-AES instruments, separate electron and ion beam columns are placed at an angle to one another. Although such an instruments can provide in situ SEM monitoring of FIB changes to a sample's surface or elemental identification, its spatial resolution is compromised by the fact that it uses a separate objective lens for each column, making it difficult to attain short working distances. On the other hand, FIB-SIMS systems typically operate with a single liquid metal source, usually Gallium, and although SIMS analysis is possible, it is preferable to have the more usual primary ion beams of Cesium and Oxygen available, due to their enhanced secondary ion yield. To make this feasible, a multi-ion beam dual FIB-SIMS instrument is required.

In the following, therefore, we describe a multi-beam charged particle instrument design, one that can simultaneously focus electrons, and a wide variety of positive and negative ion species, such as Gallium, Oxygen and Cesium ions onto the same sample. In addition, the instrument is designed to capture the spectrum of both secondary electrons and ions in parallel, in effect, combining spectroscopic SEM, FIB, SIMS and AES. The design is an advantageous extension, with a much wider range of capabilities and applications, of the present inventor's previous Spectroscopic SEM (SPS-SEM), US published application 2006/0060782A1, which is hereby incorporated fully by reference.

SUMMARY OF THE INVENTION

It is a first object of this invention to provide a multi-beam charged particle instrument that can simultaneously focus electrons and a variety of ions on a material sample.

It is a second object of the present invention to provide such an instrument wherein the electron beam can be operated in a scanning electron microscope mode (SEM.

It is a third object of the present invention to provide such an instrument wherein subsequent scattered ions can be collimated and focused to provide a high-resolution mass sprectrometer.

It is a fourth object of the present invention to provide such an instrument wherein scattered electrons can be focused to provide an energy spectrometer.

It is a fifth object of the present invention to provide such an instrument wherein an electron beam and an ion beam can be operated in parallel to provide a highly dispersive mass/energy spectrometer, providing, thereby, far more advantages and capabilities than a separately operating SEM and mass spectrometer.

It is a sixth object of the present invention to provide such an instrument wherein secondary, backscattered and Auger electrons can be captured and analyzed.

These objects will be met by a multi-beam charged particle instrument that can simultaneously focus an electron beam and a variety of primary ion beams upon a material sample and can then analyze the energy/mass spectra of emitted electron and secondary ion species from the sample. A simplified schematic description of the invention meeting these objects is now presented.

Referring first to FIG. 1, there is shown a schematic layout indicating ray paths of a charged particle beam containing electrons (4) and a single exemplary primary positive ion species (5) in a multi-ion/electron common axis column. Each primary beam is indicated by a solid line (4), (5) while scattered particles are represented by a dashed lines (7) (9). During instrument operation, more than two beams could be active, typically an electron beam and one or more primary ion beams that could be positive or negative.

To accommodate both types of charged particles (electrons and ions) here are two beam separators, one for electron beams (beam separator 1 (10)) and one for ion beams (beam separator 2 (20)). These beam separators consist of two circular magnetic sector plates (see discussion below for FIG. 3), which are able to deflect a charged particle beam while at the same time focus it like a round lens, a feature known as stigmatic focusing (see: M. Osterberg and A. Khursheed, "Simulation of magnetic deflector aberration properties for low energy microscopy", Nucl. Instrum. and Method in Phys. Res., A 555 (2005), p 20-30). The central concept underlying the instrument is to use beam separators of this kind to bend both primary ion (5) and electron (4) beams incident on the material target (15) and to then act to disperse subsequent scattered ions/electrons that travel in the opposite direction (7), (9). A beam separator used in this dual way constitutes the first stage of an energy/mass spectrometer. A similar concept, albeit one that is much narrower in scope and generality, has been applied to an electron beam only and has previously been incorporated by the author in an SEM design that can incorporate a parallel energy spectrometer for the scattered electrons (see US Published Application 2006/0060782A1 cited above and fully incorporated herein by reference). In the present invention, two beam separators are shown to be capable of operation singly and in parallel so that the same concept that is applicable to electrons can also be applied to ions and to ions and electrons in combination, making it possible to design a versatile parallel mass spectrometer that can be used alongside an energy spectrometer for electrons.

To minimize deflection aberrations, each charged particle primary beam (5), (4), needs to be pre-focused so that its incoming rays are directed towards the centre of the beam separator. A primary ion beam (5), as shown in FIG. 1, is first directed towards the centre of beam separator 2 (20). The ion beam undergoes a deflection (shown as a bend in the path (50)) before traveling into an electrostatic transfer lens (60), which provides suitable pre-focusing so that it converges towards the centre of beam separator 1 (10). Beam separator 1 (10) is designed to deflect an electron primary beam down on to the same optical axis (70) as the primary ion beam. There will be a very small tendency of beam separator 1 to deflect the primary ion beam also, but because it is designed to deflect electrons, this effect will be very small and can be compensated by suitably tilting the objective lens/specimen so that the primary ion beam strikes it perpendicularly (not indicated in FIG. 1, but shown schematically in FIG. 2a). After traversing beam separator 1, both the primary ion and electron beams are focused on to the specimen by a combined electrostatic/magnetic field objective lens (80). A second embodiment of the present invention, described in FIG. 2b, will disclose a mechanism for eliminating the necessity of tilting the sample. Specimen.

The objective lens can be designed to focus the scattered secondary ions/electrons (90) from the sample surface to a point around the centre of beam separator 1, without greatly affecting the primary ion/electron beam optics. An aperture (100) placed at the top of the objective lens is used to limit the energy and angular spread of transmitted secondary ions. The scattered electrons (90) are subsequently dispersed by beam separator 1, and their energy spectrum can be captured in parallel by a multi-channel electron detector (120). The transfer lens (60) can be designed to direct. scattered ions towards the centre of beam separator 2 (20), without greatly affecting the primary ion beam, so that they will be dispersed, according to their energies and charge-to-mass ratios. Beam separator 2, therefore, forms the first stage of a highly dispersive mass spectrometer.

BRIEF DESCRIPTION OF THE DRAWINGS

FIG. 1: Schematic for ray paths in a multi-ion/electron common axis column of the present invention: The primary beam is indicated by a solid line while scattered particles are represented by a dashed line

FIG. 3: Layout of a beam separator used in the present invention and capable of acting as a round-lens: dark shaded areas indicate magnetic material, while light shaded areas denote current carrying coil.

FIG. 4: Simulated out-of-plane beam separator aberrations as a function of deflection angle for a relative energy spread of $1\times10^{-3}$ and semi-angle of 2 mrad.

FIG. 5: Example ion trajectory paths through transfer lens where source and image planes are located 50 mm above and below it. Entrance angles vary in the 0 to 20 mrad range in steps of 2 mrad. Magnetic parts to the lens are shaded in grey.
 a) 10.2 keV positively charged primary ion beam (relatively large angles used here only for clarity)
 b) 1 keV secondary negatively charged ions
FIG. 6: Simulated objective lens design
 (a) Layout
 (b) Equipotential lines
 (c) Flux lines
FIG. 8: Simulated trajectory paths of 1005 eV selected secondary ions through the beam separator and postdeflector. Initial angles at the beam separator entrance plane converge at 0, 10 and 20 mrad with respect to the vertical axis and are directed to the beam separator center. A single retarding sector unit is used to mirror the hydrogen ions for a second pass through the beam separator.

FIG. 9: Simulated trajectory paths for secondary Au ions as they arrive at the detection plane.

FIG. 10: Simulated output spectrum for secondary Au ions at the detection plane.

FIG. 11: Trajectories showing filtering and mirroring of secondary ions passing through beam separator.

FIG. 12: Table 1, showing simulated axial aberration coefficients for the objective lens.

DESCRIPTION OF THE PREFERRED EMBODIMENTS

The present invention provides two embodiments of a multi-beam charged particle instrument that can simultaneously focus an electron beam and a variety of primary ion beams upon a material sample and can then analyze the energy/mass spectra of emitted electron and secondary ion species from the sample. In the following, we will describe the component elements of the instrument and indicate how they operate to fulfill the objects of the invention.
1. The Instrument Referring now to FIG. 2a, there is shown the schematic of a first preferred embodiment of a dual electron/ion instrument that has a parallel (i.e., simultaneously operative) energy spectrometer for scattered electrons and a parallel mass spectrometer for secondary ions. The shaded area denotes parts of the instrument that are magnetic (contain magnetic fields to deflect moving charged particles). The SEM column (400), including e-gun, condenser lenses, scan unit, stigmator and aperture (not shown), directs an electron beam (4) into beam separator 1 (10), typically at 90 degrees, but angles between 45 and 90 degrees are also suitable, with respect to the vertical direction (eg. with respect to optical axis (70)). The objective lens (80) includes an immersion magnetic field as well as a retarding field/Einzel electrostatic lens. The combined (objective lens/specimen) is mounted onto a stage (not shown in detail) that can be tilted, in order to keep the primary ion beam perpendicular to the specimen after it has undergone a small deflection through beam separator 1 (10). This tilting compensation is indicated by tilt movement arrow on the base plate in FIG. 2a. A second preferred embodiment shown in FIG. 2b will disclose an electromagnetic deflector placed within the optic axis of the device that will compensate for primary ion deflections by the electron beam separator and, thereby, eliminate the need for tilting the target.

Figure 2A:
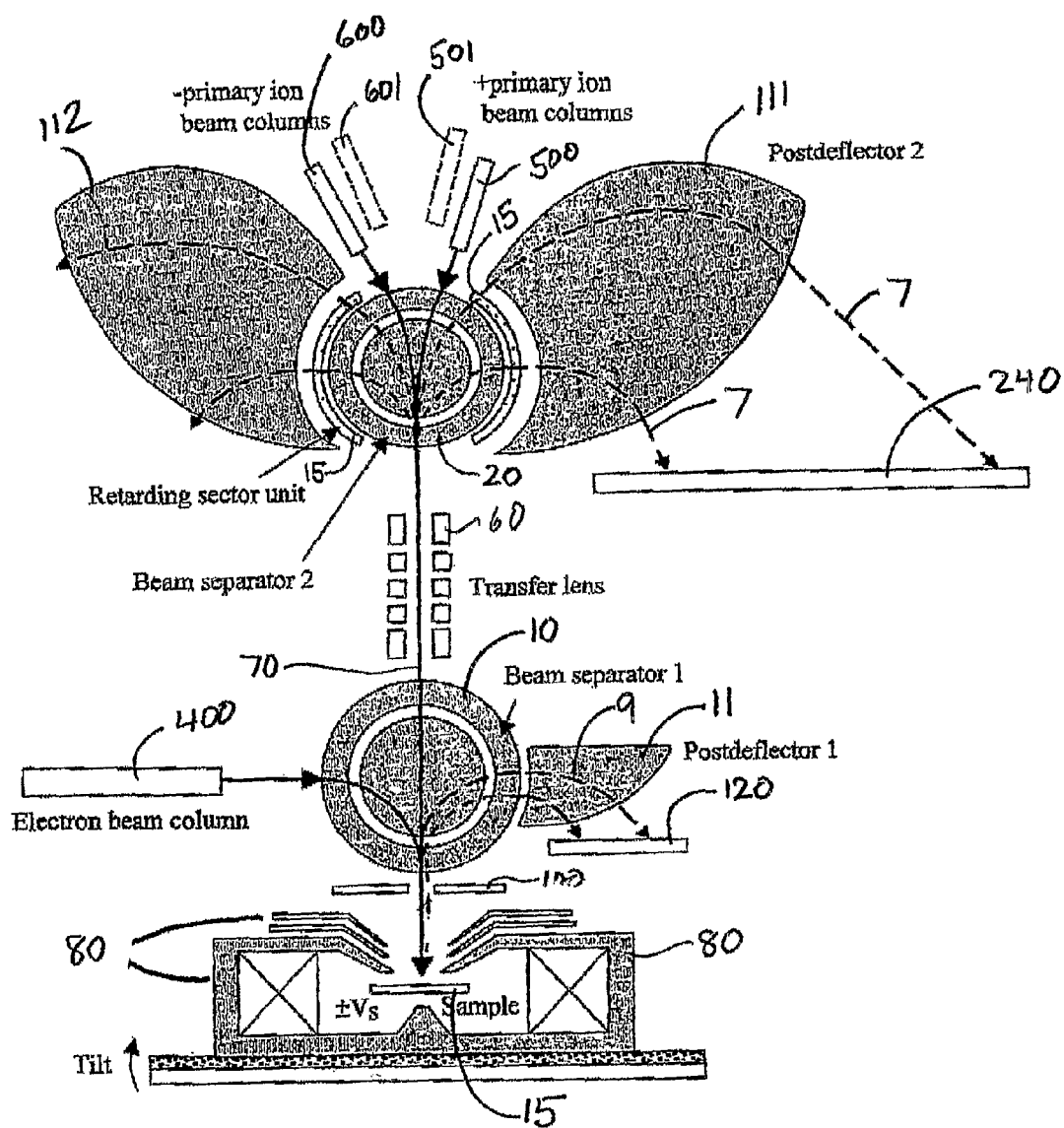
FIG. 2a: Schematic layout of a first embodiment of the multi-beam ion/electron instrument of the present invention. Solid lines denote ray paths of primary ion/electron beams, dashed lines denote ray paths of secondary ion/electrons, shaded areas represent magnetic material.
Figure 2:
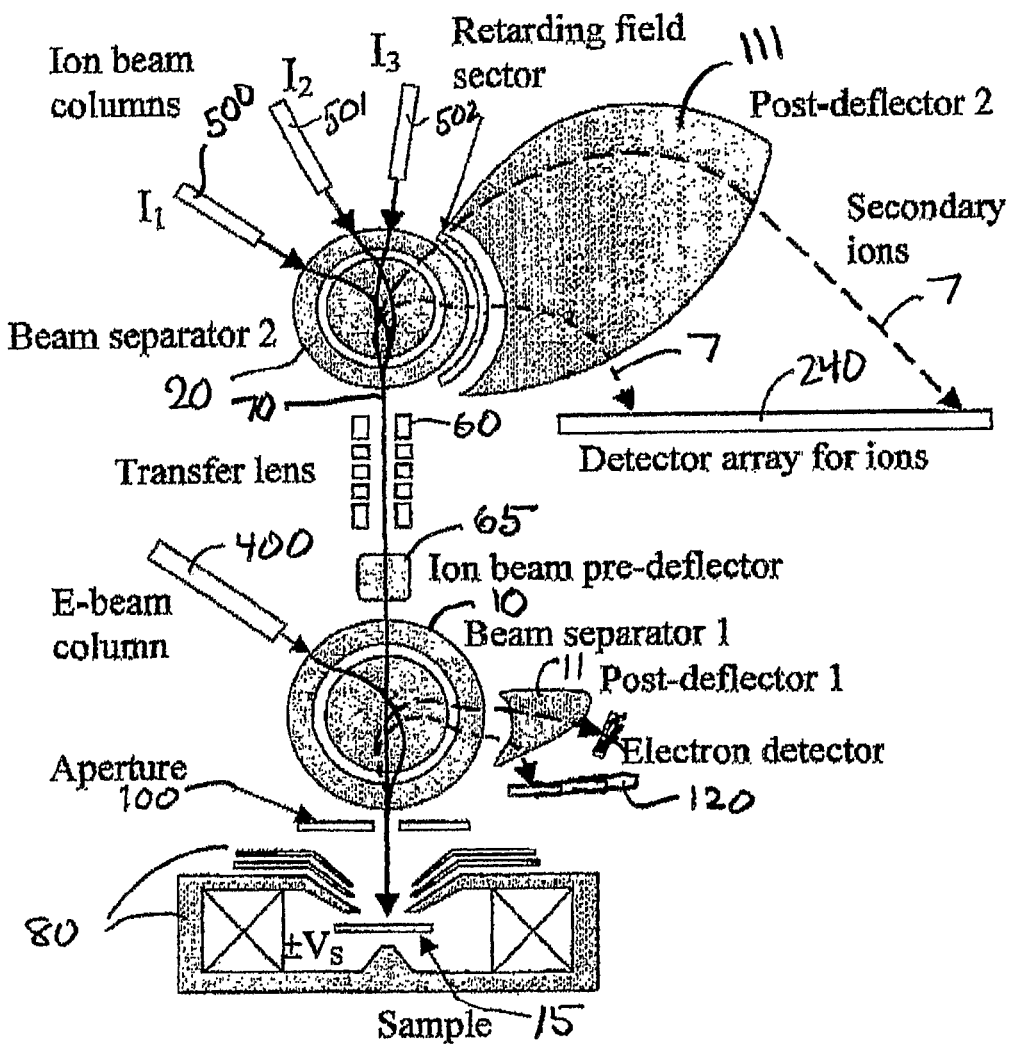
FIG. 2b: Schematic layout of a second embodiment of the multi-beam ion/electron instrument of the present invention. Solid lines denote ray paths of primary ion/electron beams, dashed lines denote ray paths of secondary ion/electrons, shaded areas represent magnetic material.

A magnetic immersion field within the objective lens is used to focus the primary electron beam, and has little effect on the primary or scattered ions. Note that this immersion field and its effect on electrons is described in published application 2006/0060782A1, which is herein incorporated fully by reference. Scattered electrons, from low energy secondary electrons through to the elastically backscattered electrons are collimated, and subsequently travel back upward along the optic axis through the objective lens. They are deflected to the right by beam separator 1 (opposite side to the electron primary beam entrance). The scattered electrons spread according to their initial emission energies. A magnetic sector plate, denoted by post-deflector 2 (11) in FIG. 2, provides first order focusing on to a spectrometer/detector arrangement (120), (see A. Khursheed, *The finite element method in charged particle optics*, Kluwer Academic Publishers, Boston, 1999 for more details). The energy spectrum of secondary, Auger and backscattered electrons can therefore be captured and analyzed in parallel. In the case of the specimen being +1 kV, where positive ions are to be captured, no secondary electrons will be detected and backscattered electrons will be used to form the image.

The upper part of the instrument consists of several independent, primary ion beam columns, each designed around a different (positive or negative) ion species such as, but not limited to, Gallium, Oxygen, Helium, Argon or Cesium. These are indicated in FIG. 2a as exemplary positive ion guns (500) and (501) and negative ion guns (600) and (601). The beam separator 2 (20) correctly bends ions from these guns along the optic axis (70).

Each column of ions, like the column for electrons, has its own source, condenser lenses, scan unit, stigmator and aperture. All ion beams enter beam separator 2 from the top, at angles appropriate to their selected gun potentials and charge-to-mass ratios. Each ion beam entry point into beam separator 2 (20) is placed so that all ion beams exit vertically from the same point. An important property of the circular magnetic sector deflectors used to form beam separators 1 and 2 is that their stigmatic focusing property does not depend on charge-to-mass ratio, or indeed, the energy of the deflected beam (Mans Osterberg *Magnetic Sector Deflector Aberration properties for Low-Energy Electron Microscopy*, PHD Thesis, National University of Singapore, to be published.) This means that the excitation strengths within beam separator 2 do not have to be readjusted for each primary ion beam separately, once it has been configured for stigmatic focusing, it applies to all beams, as long as they are deflected on to the same exit axis.

Scanning of all beams within their respective columns should be a synchronized process. A second higher energy electron beam, static (not scanned), can be used as a flood beam simultaneously with the first scanned primary beam, or in place of it. This second electron beam may be useful in neutralizing charge build up at the sample surface.

Upon entering beam separator 2, the secondary ions deflect according to their emitted energies and charge-to-mass ratios, go through electrostatic retarding sector plates (15), which may be used to mirror back or energy filter the secondary ions, and then are focused on to an array of spectrometer/detector units (240) by another magnetic sector plate, post-deflector 2 (111), (112). This embodiment includes a left-hand portion (112) and a right-hand portion (111) of the post-deflector 2, one for each sign of secondary ion. FIG. 2a illustrates this collection for negative secondary ions, a similar spectrometer arrangement on the other side of beam separator 2 (not shown) can be used for the positive secondary ions. By using the objective and transfer lenses to direct the scattered ions into the centers of beam separators 1 and 2, the angular spread of detected secondary ions is greatly reduced at the detector plane, in effect, making the spectrometer for ions both a mass spectrometer as well as an energy one. In comparison to conventional magnetic sector mass spectrometers used in SIMS which usually operate around a single pass energy, the spectrometer here will therefore be able to provide more information about the ions. It is likely that the extra information provided by the shape of the ion emission energy spectrum may help in providing better mass discrimination and shorten in data acquisition times. Another key feature of the mass spectrometer is that it is a highly dispersive one, one that can simultaneously capture secondary ions across the entire range of the periodic table.

A retarding sector unit (15) is placed around beam separator 2 (20), as shown in FIG. 2a This provides for the possibility of energy filtering the secondary ions or mirroring them back through the beam separator for a second pass. The energy filtering of the secondary ions provides flexibility in the way the output signal can be formed, and helps to prevent the mixing of energy and charge-to-mass information. By forming a subtraction signal at the output, where the signals with and without energy filtering are subtracted from one another, the energy range collected electrons can be limited, improving mass discrimination between different ion species. For instance, if the specimen voltage is −1000V, 1000 eV gold ions will trace exactly the same trajectory as 1009.636 eV platinum ions. In this case, it is desirable to limit the collected energy spectrum to say 9 eV, so that there can be no overlap between gold and platinum ions at the output detector. In order to do this, first the output is captured for no energy filtering, then a second output signal is recorded for −1009 V at the retarding sector. By subtraction of the two signals, the output corresponding to all secondary ions having emission energies below 9 eV will be detected. In this way, both mass separation, as well as energy spectrum information is captured in parallel.

Referring next to FIG. 2b, there is shown a second embodiment of the present invention. This embodiment differs from the device illustrated in FIG. 2a in two ways, in all other respects it is identical. The first difference is the addition of a magnetic ion beam pre-deflector (65) placed between the transfer lens (60) and beam separator 1 (10). The purpose of this pre-deflector is to compensate for the effects of any deflection of the primary ion beam as it passes through beam separator 1 (10). In the embodiment of FIG. 2a, these effects were compensated by tilting the sample. In this embodiment, such tilting becomes unnecessary. A second feature of this second embodiment is the elimination of the left-hand side of post deflector 2 (indicated as (112) in FIG. 2a). This embodiment therefore has only a single-sided ion post deflector (11). Since the instrunent will only produce secondary ions of one sign during its operation (primary ions being supplied by guns (500), (501), (502), a single post deflector will serve the purpose of separating the secondary ions and impinging them on the detector array (240). If ions of another sign are required, the magnetic field in the beam separator can be reversed. All other features of this embodiment are identical to those in FIG. 2a and are numbered identically.

2. The Beam Separator

It is important to ensure that beam separators 1 and 2 do not significantly degrade primary beam probe sizes at the specimen. Referring to FIG. 3, there is shown the geometrical layout of the beam separator of the present invention. This device can achieve deflection and stigmatic focusing of the primary beam that is directed at the target, while simultaneously acting to disperse scattered electrons/ions that are emanating from the target. Viewed from the side, it consists of two circular sector plates surrounded by a round magnetic shielding cover. The inner plate (100) is surrounded by an outer plate (200) and the entire device is surrounded by a shielding cover (300). The flux lines in the plan view were plotted using finite element programs written by the inventor (see: A. Khursheed, *The finite element method in charged particle optics*, Kluwer Academic Publishers, Boston, 1999). A detailed analysis of the beam separator aberrations for 90 degree deflection of electron beams has already been reported (M. Osterberg and A. Khursheed, "Simulation of magnetic deflector aberration properties for low energy microscopy", Nucl. Instrum. and Method in Phys. Res., A 555 (2005), p 20-30) which predicts that the effective on-axis aberrations of the beam separator for a 6 keV with an energy spread of 0.6 eV lie well into the pico-meter range, negligible compared to the nanometer resolution achievable by field emission scanning electron microscopes. In this paper, the previous analysis on electron beams will be extended to ion beams. It is also noted that the use of a beam separator in an SEM instrument is described in US published application 2006/0060782A1 cited above.

It is important to estimate the beam separator aberrations for ions beams, since most ion beams have energy spreads that are typically an order of magnitude larger than electron beams. The beam separator aberrations are also expected to decrease with deflection angle, which in the present instrument design, lie well below 30 degrees for ion beams.

The mathematical method used for calculating the magnetic scalar potential distribution is identical to that reported in M. Osterberg and A. Khursheed, "Simulation of magnetic deflector aberration properties for low energy microscopy", Nucl. Instrum. and Method in Phys. Res., A 555 (2005), p 20-30 where a semi-analytical technique uses a finite element solution in combination with a Fourier-Bessel series expansion. Direct ray tracing of electrons entering the beam separator for a wide variety of initial positions, angles and energies is performed by using a standard variable step $4^{th}$ order Runge-Kutta method (A. Khursheed, *The finite element method in charged particle optics*, Kluwer Academic Publishers, Boston, 1999)

Electrons are assumed to converge towards the beam separator centre as they enter it. By generating ray paths over a wide variety of initial angles and energies, and subsequently monitoring their exit output positions and angles, the chromatic and spherical aberration properties of the beam separator are calculated.

Using the mathematical methods discussed above, trajectories were plotted for a 10 keV Gallium beam having a relative energy spread of $10^{-3}$ (10 eV) with input angles ranging from 0 to 5 mrad. If the objective lens demagnifies the primary ion beam size down by a factor of 10, semi-angles at the specimen will range from 0 to 50 mrad. Large landing angles of this kind may be required in SIMS in order to obtain sufficient adequate beam current, the probe size however, will be relatively large, typically of the order of several hundreds of nanometers. Two cases of beam angle deflection are considered here, 30 degrees and 90 degrees. It is assumed that the beam separator operates with unity magnification (equal input and exit angles). The scalar potentials on the inner and outer plates for stigmatic focusing and low aberrations are of opposite sign, where the excitation on the inner plate is 7.07 times greater than the outer plate excitation. The in-plane aberrations, that is, aberrations within the deflection plane, were found to be several orders of magnitude smaller than the out-of-plane aberrations, aberrations in the direction perpendicular to the deflection plates, therefore only out-of-plane aberrations will be reported here.

Referring to FIG. 4, there is shown simulated out-of-plane beam separator aberrations as a function of exit angle. After demagnification by the objective lens, these aberrations will be less than 1 nm for 90 degrees deflection, and less than 0.08 nm for 30 degrees deflection. Compared to the primary ion probe size for such operating conditions (greater than several hundreds of nano-meters in size), the effect of the beam separator aberrations at the specimen are therefore expected to be relatively small.

3. The Transfer Lens

Examples of simulated ion trajectory paths through the transfer lens (denoted as (60) in FIG. 1, FIG. 2*a* and FIG. 2*b*) are shown in FIG. 5*a* and FIG. 5*b* for a 10.2 keV positively charged ion primary beam and negatively charged 1 keV secondary ions. The finite element programs and ray tracing routines used were written by the author and are reported in detail elsewhere (A. Khursheed, *The infinite element method in charged particle optics*, Kluwer Academic Publishers, Boston, 1999)

The lens consists of three internal electrostatic electrodes. The lower internal electrode (6 kV) is set to focus the primary beam, into the centre of beam separator 1. Referring to FIG. 5*a*, there is shown a simulated path for the primary beam, which is assumed to start 50 mm above the top of the lens, and where the focus point is located 50 mm below the bottom edge of the lens. The voltage of the upper internal electrode is adjusted to focus the secondary ions towards the centre of beam separator 2, and only marginally affects the primary beam optics. FIG. 5*b* depicts secondary ion trajectory paths that start 50 mm below the lens, and are focused 50 mm above it by selecting the upper electrode to be −600 V. FIG. 5 depicts a situation where the primary beam energy is around one order of magnitude more energetic than the secondary ions, so naturally the lens strongly focuses the scattered ions inside it. Where the secondary and primary ions have similar energies and the same sign, such as the case where low landing energies at the specimen are desired, the middle electrode of the transfer lens can be used to retard both primary and secondary ions.

4. Objective Lens

Referring to FIG. 6*a*, there is shown one possible objective lens and design and FIG. 6*b* and FIG. 6*c* depict finite element solutions of its field distributions for that design. The upper electrostatic part of the objective lens is used to focus the primary ion beam on to the sample, and it has a lower electrode whose potential ($V_1$) approaches the gun potential of the ion beam, effectively retarding the primary ions in the lens. When the primary ion beam consists of positive ions, this lens acts as a weak accelerating lens for the primary electron beam. For a negative primary ion beam, both the ion beam and electron beam will be retarded, and the energy of the electron beam can be deliberately chosen to be higher than that of the ion beam, so that it can additionally be focused by the magnetic field. The magnetic field part of the objective lens has only a marginal effect on the ions due to the ions having 4 to 5 orders of magnitude smaller charge-to-mass ratio than electrons. Fine focusing adjustments may be achieved through varying the focal strengths of lenses within each charged particle beam column before their respective beams enter the beam separators. It should be noted here that charged particles of the same sign and same energy are focused to the same point by electrostatic lenses, independent of their charge-to-mass ratio magnitude, but charged particles of the opposite sign behave quite differently, since one is accelerated while the other is retarded. An aperture to reduce the energy and angular spread of the scattered ions to be detected is placed at the top of the objective lens, shown in FIG. 2a and FIG. 6a For high landing primary ion beam energies, say 10 keV or more, the specimen is biased in such a way so as to scatter back secondary ions opposite in charge to the primary ion beam. In order to focus a positive primary ion beam at 10 kV on to a −1 kV specimen, giving a landing energy of 11 kV, $V_1$ typically needs to be biased to values around 9 kV. As long as the specimen biasing is relatively small compared to the primary beam voltage, its focusing properties will be largely determined by the value of $V_1$. On the other hand, for low landing energies, the primary beam voltage, the pole-piece voltage $V_1$, and the specimen voltage will all be of the same sign and similar magnitude.

Simulated on-axis aberrations of the objective lens design shown in FIG. 6 are summarized in Table 1, displayed in FIG. 12. For ease of simulation, the lens voltages were fixed ($V_1$=+9.1 kV, $V_2$=0, $V_3$=0), and the primary beam voltage was varied to find the correct focusing conditions. Table 1a shows that the focal length of all lenses, whether it be for high or low landing energies, is less than 3 mm. On-axis aberration coefficients are less than 20 mm. These aberrations at 1 pA beam current translate into predicted spot sizes of less than 0.1 μm for duoplasmatron sources, and less than 20 nm for cesium surface ionization sources, a factor of 1 to 2 better than conventional SIMS objective lenses [6]. In these calculations, the diffraction, chromatic, spherical and Gaussian beam were combined together with the root-power sum formula of Barth and Kruit (J. E. Barth and P. Kruit, "Addition of different contributions to the charged particle probe size", Optik, 101, No. 3 (1996), p 101-9). The predicted aberrations and spot sizes for the primary electron and Gallium beam are naturally much lower, due to the high brightness of their respective sources, and in the case of the electron beam, better optics of the immersion magnetic lens.

Figure 7A:
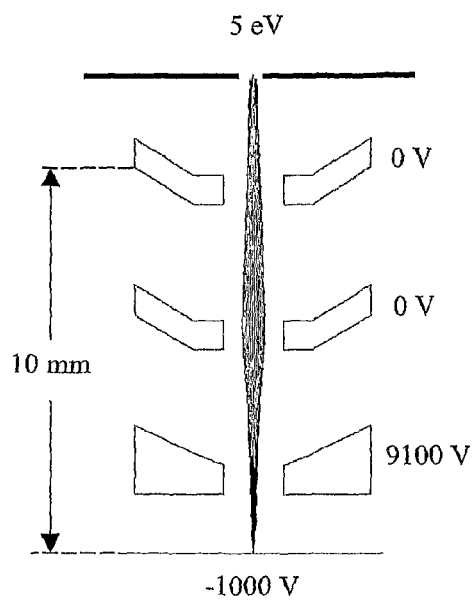
FIG. 7a-FIG. 7d: Simulated trajectory paths of negative secondary ions through the objective lens. The emission angle varies from 0 to 1.3 radians in intervals of 0.1
 (a) 5 eV energy with $V_2=0$
 (b) 5 eV energy with $V_2=600$ V
 (c) 5 eV energy with $V_2=425$ V
 (d) 30 eV energy with $V_2=425$ V
Figure 7B:
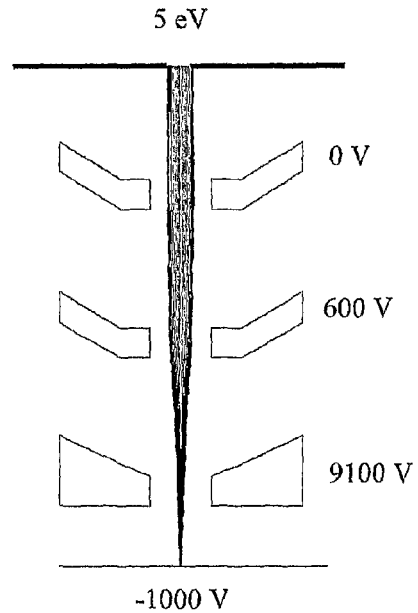
Figure 7C:
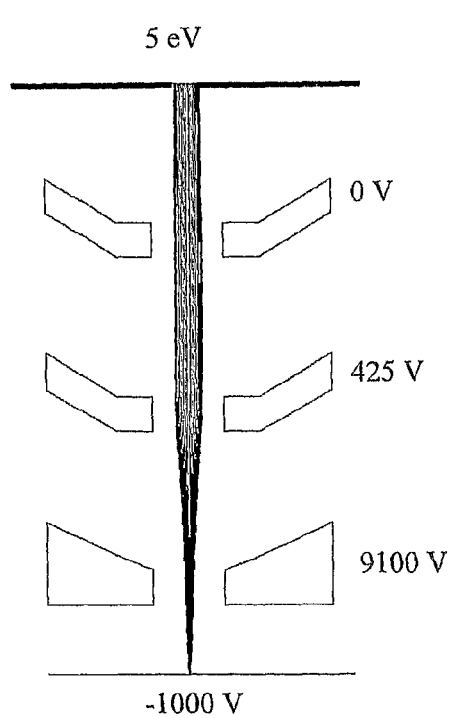
Figure 7D:
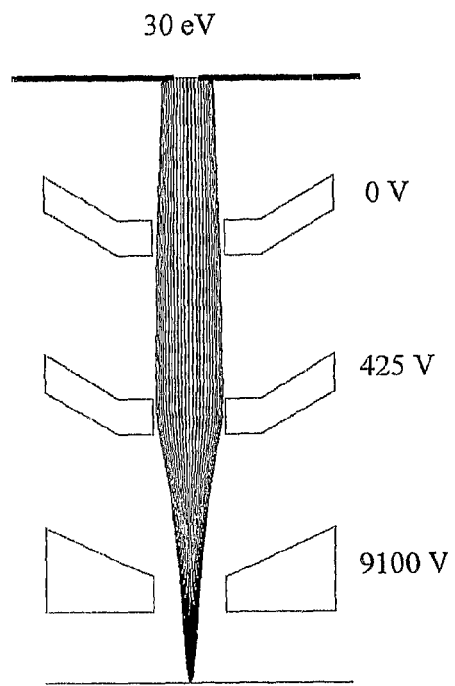

FIGS. 7a-7d shows simulated trajectory ion paths in the objective lens for different values of $V_2$. For $V_2$=0 (FIG. 7a), 5 eV negative secondary ions tend to focus close to the top of the objective lens. For $V_2$=600 V (FIG. 7b), they appear to come from a virtual point located below the specimen, and for $V_2$=425 V (FIG. 7c), they focus a distance of 73 mm above the specimen. These results demonstrate that $V_2$ can be appropriately biased so as to focus the secondary ions where desired, which in this case, is to be at the centre of beam separator 1. Small variations on $V_2$ of this kind did not greatly affect the focal point or on-axis aberrations of a 10 kV positively charged primary beam. FIG. 7d shows that 30 eV negative secondary ions tend to spread out significantly more than the 5 eV ones, demonstrating that an aperture placed at the top of the objective lens will be effective in limiting the angular and energy spread of secondary ions. Assuming that the secondary ions are emitted with a cosine angular distribution, the percentage transmission of secondary ions for a 200 μm radius aperture placed at the top of the objective lens is 100% at 1 eV, 29.59% at 5 eV, 13.38% for 10 eV and 4.92% at 30 eV.

5. The Mass Spectrometer

FIG. 8 shows simulated 1005 eV trajectory paths through beam separator 2 and post-deflector 2 for six different secondary ion species, ranging from hydrogen to gold. A single retarding sector unit is used to mirror the hydrogen ions for a second pass through the beam separator. The dashed line indicates the first-order focusing plane where the multi-channel detector should be placed. Also indicated on the diagram is the trajectory path of a 10 kV Gallium ion primary beam. The secondary ions start at the beam separator entrance with converging angles of ±10 mrad and ±20 mrad angles with respect to the vertical axis, and are directed towards its centre. FIG. 8 shows that the secondary ions are dispersed over a wide range of angles as they exit the beam separator, and that the post-deflector is able to focus and separate them at the detection plane. The entrance angles in this example are deliberately made large (up to 20 mrad), so that the focusing action at the detector plane can be clearly seen. Simulation of secondary ion trajectory paths leaving the specimen and passing successively through the objective lens, a 200 μm radius aperture, beam separator 1 and the transfer lens, were found to arrive at the entrance of beam separator 2 with the widest entrance angles being: 2.8 mrad for 1 eV, 2.78 mrad for 5 eV, and 2.0 mrad for 10 eV, substantially lower than the 0 to 20 mrad angles assumed for the trajectory paths shown in FIG. 8.

FIG. 9a, FIG. 9b and FIG. 9c show simulated trajectory arriving at the detector plane for gold ions emitted at the energies of 1, 5 and 10 eV from a specimen biased to −1 kV. FIG. 9a is plot for trajectories starting at the beam separator 2 entrance plane with input converging angles of ±10 mrad, while FIGS. 9b and 9c are plot for trajectories that leave the specimen over emission angles that range from 0 to 1.5 radians, and are plot successively through the objective lens, beam separator 1 and the transfer lens before entering beam separator 2. FIG. 9b represents the situation where a 200 μm radius aperture is used, while FIG. 9c illustrates the effect of a 600 μm aperture radius aperture. As shown from these figures, the effect of angular dispersion at the detection plane is predicted to be relatively low. Although the combined effect of objective and transfer lens spherical aberrations cause the secondary ions to be spread out around the centre of beam separator 2, with variations as large as 15% of the beam separator radius, the projected angles are relatively low, typically less than 4 mrad. The effective angular spread at the detection plane for a 200 μm radius aperture (FIG. 9b) is predicted to be similar to ray paths that start at the entrance of beam separator, converging towards its centre with maximum angles ±10 mrad (FIG. 9a). The angular spread effect at the detection plane is visibly increased for larger secondary ion apertures, as indicated by FIG. 9c, however, it is still relatively small, corresponding to effective energy spreads of only a fraction of an eV. For the 200 μm radius aperture, the maximum effective energy spread due to angular dispersion at the specimen estimated from simulation was found to be below 0.1 eV for all 1, 5 and 10 eV secondary gold ions. This result is more clearly shown in FIG. 10, which plots the detection plane distribution of the gold secondary ions traced in FIG. 9b. Here a ±2σ gaussian distribution is fit inside points that mark the maximum dispersion around the central ray of each emission energy. The energy resolution, taken to be approximately the σ of each Gaussian fit, lies below 0.022 eV for all trajectory energies considered (10 eV or below). From these simulation results, it can be concluded that the mass spectrometer presented here is expected to be able to capture the energy spectrum of each scattered secondary ion species in parallel (typically up to 10 eV for a specimen bias of −1 kV).

Biasing the specimen to larger magnitude voltages, say −5 kV, will allow for the capture of a wider energy spectrum and produce better separation between secondary ion species, however, it will in turn require greater magnetic field strengths within the beam separator and the postdeflector sector. In order to produce trajectory paths similar to those indicated in FIG. 6 for a specimen bias of −5 kV, the maximum magnetic field strength inside the beam separator must reach around 1.7 Tesla, which, for reasons of magnetic saturation, is not practical. However, this problem may be overcome by scaling up the beam separator's transverse dimensions.

FIG. 11 demonstrates the reflection and filtering action of the electric retarding sector around the beam-separator (see (15) in FIG. 2a and FIG. 2b). Secondary ion trajectory paths are plotted for the specimen having −5 kV and an emission energy of 5 eV. The secondary ions start at the beam separator entrance with converging angles of ±10 mrad and ±20 mrad angles and are directed towards its centre. The retarding filter electrode is set to −5006 V. The figure illustrates that heavy 5 eV secondary ions will be reflected for a second pass, but will emerge on the left-hand side of the beam separator, whereas the light secondary ions, such as hydrogen will undergo multiple reflections and emerge on the right-hand side of the beam separator. By suitable biasing of the electric sector, secondary ions over several different energy ranges can therefore be captured simultaneously.

As is finally understood by a person skilled in the art, the preferred embodiment of the present invention is illustrative of the present invention rather than limiting of the present invention. Revisions and modifications may be made to methods, constructs, materials, structures and dimensions of a multi-beam charged particle instrument that can simultaneously focus an electron beam and a variety of primary ion beams upon a material sample and can then analyze the energy/mass spectra of emitted backscattered and secondary electrons and secondary ion species from the sample, while still providing such an instrument in accord with the present invention as provided by the appended claims.

What is claimed is:

1. A multi-beam charged particle instrument comprising:
an electron beam source for injecting an electron beam into a first beam separator;
a plurality of primary ion beam sources, wherein each source is for injecting a primary ion beam into a second beam separator;
a first beam separator to receive said injected electron beam;
a first post-deflector mounted adjacent to said first beam separator;
a second beam separator to receive each of said plurality of primary ion beams;
a second post-deflector mounted adjacent to said second beam separator
a transfer lens between said first and second beam separators;
an aperture mounted below said first beam separator;
a tiltably mounted objective lens below said aperture;
a material target mounted within said objective lens and tiltable therewith to maintain a position with respect to said ion beams; wherein
said second beam separator, said transfer lens, said first beam separator, said aperture and said objective lens are mounted, in sequential order, centrally co-linearly with an optic axis; and wherein
said first beam separator can deflect said electron beam and direct said electron beam along said optic axis towards said objective lens; and wherein
said second beam separator can deflect each of said primary ion beams and direct each of said primary ion beams along said optic axis towards said objective lens, wherein
said electron beam passes through said aperture and through said objective lens and, independently of the presence of said ion beams, is focused thereby on said material target; and wherein
each of said primary ion beams passes through said first beam separator, said transfer lens, said aperture and said objective lens and, independently of the presence of said electron beam, is focused thereby on said material target.

2. The instrument of claim 1 wherein each of said plurality of primary ion sources can inject a different species of ion and wherein the energy of each of said species can be varied.

3. The instrument of claim 2 wherein each of said plurality of primary ion sources can be positioned at an angle relative to the optic axis to insure the emergence of its ion beam from said second beam separator at the same position.

4. The instrument of claim 2 wherein said retarding sector plates provide an adjustable electrostatic retarding force to be placed on secondary ions emerging from said second beam separator.

5. The instrument of claim 4 wherein said retarding force can be made sufficient to prevent the emergence of selected secondary ions or can cause selected secondary ions to reverse their trajectories an return to said second beam separator along a path that mirrors their emerging path.

6. The instrument of claim 5 wherein said secondary ions can thereby be identified according to their chemical species and energy.

7. The instrument of claim 1 further including electrostatic retarding sector plates mounted between said first beam separator and said first post-deflector and between said second beam separator and said second post-deflector.

8. The instrument of claim 1 wherein said transfer lens collimates and focuses primary ions directed along said optic axis towards said first beam separator and collimates and focuses secondary ions directed along said optic axis towards said second beam separator.

9. The instrument of claim 8 wherein said transfer lens is an electrostatic focusing lens, comprising a sequence of three axially symmetric and substantially annular electrodes, each electrode being at a selected electrical potential and the axis of each of said three electrodes being collinear with said optic axis.

10. The instrument of claim 1 wherein said injected electron beam can be scanned in a raster pattern across said material target to produce, thereby, the surface visualization of a scanning electron microscope.

11. The instrument of claim 1 wherein said electron beam can strike said material target producing, thereby, an energy dependent distribution of backscattered electrons, secondary electrons and Auger electrons, these electron species thereupon being focused and collimated and passing upward through said objective lens, along said optic axis in a common trajectory and into said first beam separator.

12. The instrument of claim 11 whereupon said first beam separator can spatially separate said electron species according to their energies and cause them to emerge from said first beam separator along separate trajectories.

13. The instrument of claim 12 wherein the separate trajectories of said electron species pass through said first post-deflector whereby they are caused to be collected and to have their energies determined at a collection plate.

14. The instrument of claim 1 wherein each said primary ion beam can strike said material target producing, thereby, an energy dependent distribution of secondary ions, said ions thereupon passing upward along a common trajectory, through said objective lens, along said optic axis and passing, thereby, through said first beam separator, said transfer lens and into said second beam separator.

15. The instrument of claim 14 wherein said second beam separator spatially separates said secondary ions according to their energies and causes them to emerge from said second beam separator along separate trajectories.

16. The instrument of claim 15 wherein the separate trajectories of said secondary ions pass through a second post-deflector whereby they are caused to be collected and analyzed at a planar detection plate.

17. The instrument of claim 16 wherein said second post-deflector comprises two magnetically deflecting elements, the said elements being symmetrically placed on the left-hand side and the right-hand side of said second beam separator, whereby they cause positive secondary ions to be emitted to one side of said second beam separator and negative secondary ions to be emitted on the opposite side of said second beam separator, at each of which said sides they can be collected and analyzed at a planar detection plate.

18. The instrument of claim 16 wherein the angular dispersion of said separate trajectories is sufficiently small so that a high degree of energy resolution between said separate trajectories is obtained at said planar detector plate.

19. The instrument of claim 1 including the use of a non-scanned electron flood beam to neutralize the buildup of charges on the target surface.

20. A multi-beam charged particle instrument comprising: an electron beam source for injecting an electron beam into a first beam separator;
a plurality of primary ion beam sources, wherein each source is for injecting a primary ion beam into a second beam separator;
a first beam separator to receive said injected electron beam;
a first post-deflector mounted adjacent to said first beam separator;
a second beam separator to receive each of said plurality of primary ion beams;
a second post-deflector mounted adjacent to said second beam separator
a transfer lens between said first and second beam separators;
a pre-deflector mounted between said transfer lens and said first beam separator;
an aperture mounted below said first beam separator;
an objective lens mounted below said aperture;
a material target mounted within said objective lens; wherein
said second beam separator, said transfer lens, said pre-deflector, said first beam separator, said aperture and said objective lens are mounted, in sequential order, centrally co-linearly with an optic axis; and wherein
said first beam separator can deflect said electron beam and direct said electron beam along said optic axis towards said objective lens; and wherein
said second beam separator can deflect each of said primary ion beams and direct each of said primary ion beams along said optic axis towards said objective lens, wherein
said electron beam passes through said aperture and through said objective lens and, independently of the presence of said ion beams, is focused thereby on said material target; and wherein
each of said primary ion beams passes through said first beam separator, said transfer lens, said pre-deflector, said aperture and said objective lens and, wherein
said pre-deflector compensates for any deviation of said ion beams from said optic axis caused by the passage of said ion beams through said first beam separator; and wherein each of said ion beams, independently of the presence of said electron beam, is focused thereby on said material target.

21. The instrument of claim 20 wherein each of said plurality of primary ion sources can inject a different species of ion and wherein the energy of each of said species can be varied.

22. The instrument of claim 21 wherein each of said plurality of primary ion sources can be positioned at an angle relative to the optic axis to insure the emergence of its ion beam from said second beam separator at the same position.

23. The instrument of claim 20 further including electrostatic retarding sector plates mounted between said first beam separator and said first post-deflector and between said second beam separator and said second post-deflector.

24. The instrument of claim 23 wherein said retarding sector plates provide an adjustable electrostatic retarding force to be placed on secondary ions emerging from said second beam separator.

25. The instrument of claim 24 wherein said retarding force can be made sufficient to prevent the emergence of selected secondary ions or can cause selected secondary ions to reverse their trajectories an return to said second beam separator along a path that mirrors their emerging path.

26. The instrument of claim 25 wherein said secondary ions can thereby be identified according to their chemical species and energy.

27. The instrument of claim 20 wherein said transfer lens collimates and focuses primary ions directed along said optic axis towards said first beam separator and collimates and focuses secondary ions directed along said optic axis towards said second beam separator.

28. The instrument of claim 27 wherein said transfer lens is an electrostatic focusing lens, comprising a sequence of three axially symmetric and substantially annular electrodes, each electrode being at a selected electrical potential and the axis of each of said three electrodes being collinear with said optic axis.

29. The instrument of claim 20 wherein said injected electron beam can be scanned in a raster pattern across said material target to produce, thereby, the surface visualization of a scanning electron microscope.

30. The instrument of claim 20 wherein said electron beam can strike said material target producing, thereby, an energy dependent distribution of backscattered electrons, secondary electrons and Auger electrons, these electron species thereupon being focused and collimated and passing upward through said objective lens, along said optic axis in a common trajectory and into said first beam separator.

31. The instrument of claim 30 whereupon said first beam separator can spatially separate said electron species according to their energies and cause them to emerge from said first beam separator along separate trajectories.

32. The instrument of claim 31 wherein the separate trajectories of said electron species pass through said first post-deflector whereby they are caused to be collected and to have their energies determined at a collection plate.

33. The instrument of claim 20 wherein each said primary ion beam can strike said material target producing, thereby, an energy dependent distribution of secondary ions, said ions thereupon passing upward along a common trajectory, through said objective lens, along said optic axis and passing, thereby, through said first beam separator, said pre-deflector, said transfer lens and into said second beam separator.

34. The instrument of claim 33 wherein the separate trajectories of said secondary ions pass through a second postdeflector whereby they are caused to be collected and analyzed at a planar detection plate.

35. The instrument of claim 34 wherein said second post-deflector comprises one magnetically deflecting element, said element being placed on one side of said second beam separator, whereby it causes secondary ions of a selected sign to be emitted to said one side of said second beam separator, at which said side they can be collected and analyzed at a planar detection plate.

36. The instrument of claim 34 wherein the angular dispersion of said separate trajectories is sufficiently small so that a high degree of energy resolution between said separate trajectories is obtained at said planar detector plate.

37. A method of operating a multi-beam charged particle instrument comprising:
mounting a material target within a tiltable objective lens;
having an electron beam source direct an electron beam into a first beam separator;
having each of a selected group of primary ion beam sources inject a primary ion beam into a second beam separator;
having said first beam separator direct said electron beam along an optic axis;
having said second beam separator direct each of said primary ion beams along said optic axis;
passing said primary ion beams through a focusing and collimating transfer lens between said first and second beam separators;
having said electron beam and each of said primary ion beams pass through an aperture mounted below said first beam separator and above an objective lens;
tilting said target to compensate for any deviation of said primary ion beams from said optic axis;
having said electron beam and each of said primary ion beams pass through said objective lens, being focused thereby and striking said material target mounted therein;
producing, by striking said target, an energy dependent spectrum of backscattered electrons, Auger electrons and other secondary electrons and an energy dependent spectrum of secondary ions, said electrons and said ions emerging from said objective lens, passing through said aperture and forming a collimated beam whose common trajectory lies along said optic axis;
having said backscattered, Auger and other secondary electrons enter said first beam separator and emerge as a plurality of trajectories in accord with their entering energies;
having said secondary ions pass through said transfer lens, enter said second beam separator and emerge as a plurality of trajectories in accord with their energy and species;
having said electrons pass through a first post-deflector and impinge upon a first detecting plate whereby their energies are determined;
having said ions pass through a second post-deflector and impinge upon a second detecting plate whereby their species is identified and their energies are determined.

38. The method of claim 37 further including the use of electrostatic retarding sector plates mounted between said first beam separator and said first post-deflector and between said second beam separator and said second post-deflector.

39. The method of claim 38 wherein said retarding sector plates provide an adjustable electrostatic retarding force to be exerted on secondary ions emerging from said second beam separator.

40. The method of claim 39 wherein said retarding force can be made sufficient to prevent the emergence of selected secondary ions or can cause selected secondary ions to reverse their trajectories an return to said second beam separator along a path that mirrors their emerging path.

41. A method of operating a multi-beam charged particle instrument comprising:
mounting a material target within an objective lens;
having an electron beam source direct an electron beam into a first beam separator;
having each of a selected group of primary ion beam sources inject a primary ion beam into a second beam separator;
having said first beam separator direct said electron beam along an optic axis;
having said second beam separator direct each of said primary ion beams along said optic axis;
passing said primary ion beams through a focusing and collimating transfer lens between said first and second beam separators;
passing said primary ion beams thereafter through a pre-deflector;
having said electron beam and each of said primary ion beams pass through an aperture mounted below said first beam separator and above an objective lens;
having said electron beam and each of said primary ion beams pass through said objective lens, being focused thereby and striking said material target mounted therein;
producing, by striking said target, an energy dependent spectrum of backscattered electrons, Auger electrons and other secondary electrons and an energy dependent spectrum of secondary ions, said electrons and said ions emerging from said objective lens, passing through said aperture and forming a collimated beam whose common trajectory lies along said optic axis;
having said backscattered, Auger and other secondary electrons enter said first beam separator and emerge as a plurality of trajectories in accord with their entering energies;
having said secondary ions pass through said transfer lens, enter said second beam separator and emerge as a plurality of trajectories in accord with their energy and species;
having said electrons pass through a first post-deflector and impinge upon a first detecting plate whereby their energies are determined;
having said ions pass through a second post-deflector mounted adjacent to one side of said second beam deflector and impinge upon a second detecting plate whereby their species is identified and their energies are determined.

42. The method of claim 41 further including the use of electrostatic retarding sector plates mounted between said first beam separator and said first post-deflector and between said second beam separator and said second post-deflector.

43. The method of claim 42 wherein said retarding sector plates provide an adjustable electrostatic retarding force to be exerted on secondary ions emerging from said second beam separator.

44. The method of claim 42 wherein said retarding force can be made sufficient to prevent the emergence of selected secondary ions or can cause selected secondary ions to reverse their trajectories an return to said second beam separator along a path that mirrors their emerging path.

* * * * *